United States Patent
Mengad (12)

(10) Patent No.: US 9,960,755 B2
(45) Date of Patent: May 1, 2018

(54) LOW VOLTAGE SWITCHING GATE DRIVER UNDER A HIGH VOLTAGE RAIL

(71) Applicant: Dialog Semiconductor (UK) Limited, London (GB)

(72) Inventor: Zakaria Mengad, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days. days.

(21) Appl. No.: 15/155,457

(22) Filed: May 16, 2016

(65) Prior Publication Data

US 2017/0331466 A1 Nov. 16, 2017

(51) Int. Cl.
| | | |
|---|---|---|
| H03K 5/08 | (2006.01) | |
| H03K 5/24 | (2006.01) | |
| H03K 17/687 | (2006.01) | |
| H03K 17/042 | (2006.01) | |

(52) U.S. Cl.
CPC .............. *H03K 5/084* (2013.01); *H03K 5/24* (2013.01); *H03K 5/2472* (2013.01); *H03K 17/042* (2013.01); *H03K 17/6871* (2013.01)

(58) Field of Classification Search
CPC .. H03K 17/687; H03K 17/162; H03K 17/567; H03K 17/16; H03K 17/165; H03K 5/156; H03K 5/08; H03K 5/13
USPC .......................... 327/108, 109, 110, 111, 112
See application file for complete search history.

(56) References Cited

U.S. PATENT DOCUMENTS

| | | |
|---|---|---|
| 7,088,151 B1 | 8/2006 | Dequina et al. |
| 7,459,945 B2 | 12/2008 | Omura |
| 8,054,054 B2 | 11/2011 | Lee |
| 8,085,083 B2 | 12/2011 | Zhang et al. |
| 8,724,353 B1 | 5/2014 | Giuliano et al. |
| 2012/0126859 A1* | 5/2012 | Kawamoto .......... H03K 17/163 327/108 |
| 2012/0242376 A1* | 9/2012 | Ose ........................ H03K 17/14 327/109 |

FOREIGN PATENT DOCUMENTS

EP       2 009 792      3/2015

OTHER PUBLICATIONS

"An improved gate driver for power MOSFETs using a cascode configuration," by M A H Broadmeadow et al., 7th IET International Conference on Power Electronics, Machines and Drives (PEMD 2014), Apr. 8-10, 2014, pp. 1-6.

(Continued)

*Primary Examiner* — John Poos
(74) *Attorney, Agent, or Firm* — Saile Ackerman LLC; Stephen B. Ackerman

(57) ABSTRACT

A switching gate driver and method of operating the gate driver is described. The gate driver includes a first voltage source, and a clamping voltage source configured to have a voltage that is less than that of the first voltage source. There is also a current path, for initial charging of a gate voltage of the switching gate, between the first voltage source and a ground source; and a comparator which is configured to clamp the gate voltage to the clamping voltage source as it approaches the voltage of said clamping voltage source.

17 Claims, 9 Drawing Sheets

(56) References Cited

OTHER PUBLICATIONS

"A Current Source Gate Driver Achieving Switching Loss Savings and Gate Energy Recovery at 1-MHz," by Wilson Eberle et al., IEEE Transactions on Power Electronics, vol. 23, No. 2, Mar. 2008, pp. 678-691.
"A 1-MHz High-Efficiency 12-V Buck Voltage Regulator With a New Current-Source Gate Driver," by Zhiliang Zhang et al., IEEE Transactions on Power Electronics, vol. 23, No. 6, Nov. 2008, pp. 2817-2827.
German Office Action, File No. 10 2016 213 442.6, Applicant: Dialog Semiconductor (UK) Limited, dated Mar. 8, 2017, 5 pgs. and English language translation, 5 pgs.

\* cited by examiner

LOW VOLTAGE SWITCHING GATE DRIVER UNDER A HIGH VOLTAGE RAIL

FIELD

The disclosure relates generally to variable power FET gates, power FET gate driver, power switches, voltage regulators, and methods and, more particularly, to how to implement fast switching of the power FET gate with little disturbance to the voltage supply and a method thereof.

BACKGROUND

When switching a large high voltage power FET gate that has hundreds of pF gate capacitances, depending on the process technology the gate maximum voltage rating will be limited to a much lower level than the high voltage supply (VDH). To effectively drive its switching, conventional systems tend to use systematically a well-decoupled supply where an external capacitor is often needed.

An example of a prior art large high voltage power FET gate driving circuit 700 is illustrated in a circuit schematic block diagram in FIG. 7. The circuit 700 includes the high voltage power FET 750 and the gate driving circuit 710. The driving output 736 from the gate driving circuit 710 is coupled to the gate 772 of the power FET SW1 to charge the gate capacitance.

The power FET SW1 is powered by the high voltage 778. Its gate capacitance Cg is of several hundred pF (for example, 400 pF). The voltage regulator VREG is coupled to the high voltage rail (VDH) 784 as the charging source, and is coupled to the driver B1 at 722. An external capacitance $C_{EXT}$ and an external inductance $L_{EXT}$ are coupled between GND and 722. The switching signal IN is coupled to the input 712 of the driver B1.

For an RC type charging shown in FIG. 7, if the equivalent gate capacitance is 400 pF with 6 Ohm pull up for a target 5 ns rise time through just 1 nH of supply parasitic inductance, in FIG. 8 shows the resultant gate voltage charging curve 812, the charging current curve 832, and the low voltage supply (VDL) curve 842. It is apparent that when the gate voltage is charged with a voltage swing 3.21 V within 5.016 S, the charging current 832 has a peak up to close 600 mA. Most significantly, the low voltage supply (VDL) 842 has a sharp drop from 4.0 V to 1.25 V mainly due to the peak charging current rise in ~100 ps. When the same VDL supply 722 in FIG. 7 is shared among other analog functions, either continuous or switching, such perturbation will not be acceptable.

One way to mitigate this high level noise is to use a passive local low pass filtering. But then given that in most areas the filter resistor must be small (minimizing IR drops), one ends up adding considerable on-chip decoupling, which consumes very large silicon area.

Additionally for some ICs, a dedicated pin with an external good quality capacitor is either not affordable or available but shared with other sensitive analogue core functions that could suffer indirectly from the vary large ∂i/∂t flowing through the supply stray inductance.

In other prior art a high voltage NFET can be placed between the high voltage rail (VDH) and the gate to be charged. The gate of that switch would be controlled under the low voltage supply (VDL) that provides the charge to the gate. Because the NFET will choke as the gate voltage VG gets close to the low voltage supply (VDL), then end of charge is natural. The advantage of this approach is simple in design because the NFET is naturally cut off And there is no risk of overshooting the gate. However, when VDL is low (a few high voltage FET VTs is around 1 volt), the charge will be stopped too early. The gate would not make a full excursion to the VLD voltage. The control over the charge current profile is poor. It tends to be very close to the RC-type charge as shown in FIG. 8 with a relatively impulsive profile. To complete the gate charge excursion, a significant current still has to be drawn from the low voltage supply (VDL). And an additional tricky gate sensing circuit has to be added.

In the present disclosure, the charging current profile is better controlled and the voltage ripples caused by the charging current on the low voltage supply (VDL) is greatly depressed.

SUMMARY

A principal object of the present disclosure is to provide a switching gate driver.

A further object of the present disclosure is to provide a low voltage switching gate driver under a high voltage rail (VDH).

In accordance with the objects of this disclosure, a switching gate driver is achieved. The device comprises a first voltage source, a clamping voltage source, a current path, a comparator. The said current path is used to charge a gate capacitance. The switching gate driver is configured so that an input signal to said switching gate driver controls a first switch in said current path. An output of said comparator is connected to a second switch in said current path. The said second switch is configured to be opened as said gate voltage approaches said clamping voltage. An output of said comparator is configured to clamp said gate voltage by closing a third switch to connect said clamping voltage source to said gate voltage. The said clamping voltage source is from a regulated voltage supply, and said first voltage source is from an unregulated voltage supply. The said gate voltage is an input to said comparator. The said comparator comprises a PMOS current mirror cross-coupled to a pair of NMOS devices. The said pair of NMOS devices comprise a first device N4 driven by said gate voltage, a second device N1 driven by a an output voltage Vc of said comparator, wherein a ratio between said first and second devices is about 4:1. The said PMOS current mirror comprises a first PMOS device P2 having its source connected to said gate voltage, and a second PMOS device P3 having its source connected to said clamping voltage source. The switching gate driver further comprises a PMOS device P4 having its source connected to said gate voltage, driven by said comparator output Vc, and its drain connected to a drain of said second NMOS device N1 and to a drain of said first PMOS device P2. A second input to said comparator, which configures said comparator's transition point is shifted from said clamping voltage by an amount DV, where $$DV(it = \infty) \cong V_{gs}(P3) - V_{gs}(P2) = \sqrt{\frac{It}{\mu p \cdot C_{ox} \cdot W/L}},$$

wherein Vgs(P3) is a gate-to-source voltage of said second PMOS device P3, Vgs(P2) is a gate-to-source voltage of said first PMOS device P2. $I_t$ is a transition current through said second NMOS device N1, typically is 1 mA, $C_{ox}$ is oxide capacitance per unit gate area, and W/L is a width-to-length ratio of device.

Also in accordance with the objects of this disclosure, a method for improving the switching speed of power FET and reducing the switching disturbance to the low voltage supply (VDL) is achieved. The method comprises providing a first voltage source, and a clamping voltage source having a voltage that is less than that of said first voltage source, initially charging a gate voltage of said transistor gate, via a current path between said first voltage source and a ground source, and clamping, with a comparator, said gate voltage to said clamping voltage source as it approaches the voltage of said clamping voltage source. The method wherein said initially charging a gate voltage is initiated by a transition of an input signal to close a first switch in said current path. The method wherein said clamping with a comparator opens a second switch in said current path. The method for switching a transistor gate, wherein an output of said comparator clamps said gate voltage by closing a third switch to connect said clamping voltage source to said gate voltage. The said clamping voltage source is from a regulated voltage supply, and said first voltage source is from an unregulated voltage supply. The said comparator comprises a PMOS current mirror cross-coupled to a pair of NMOS devices. The method for switching a transistor gate, wherein said pair of NMOS devices comprise a first device N4 driven by said gate voltage, a second device N1 driven by a an output voltage Vc of said comparator, wherein a ratio between said first and second devices is about 4:1.

Other advantages will be recognized by those of ordinary skills in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DESCRIPTION

Figure 1:
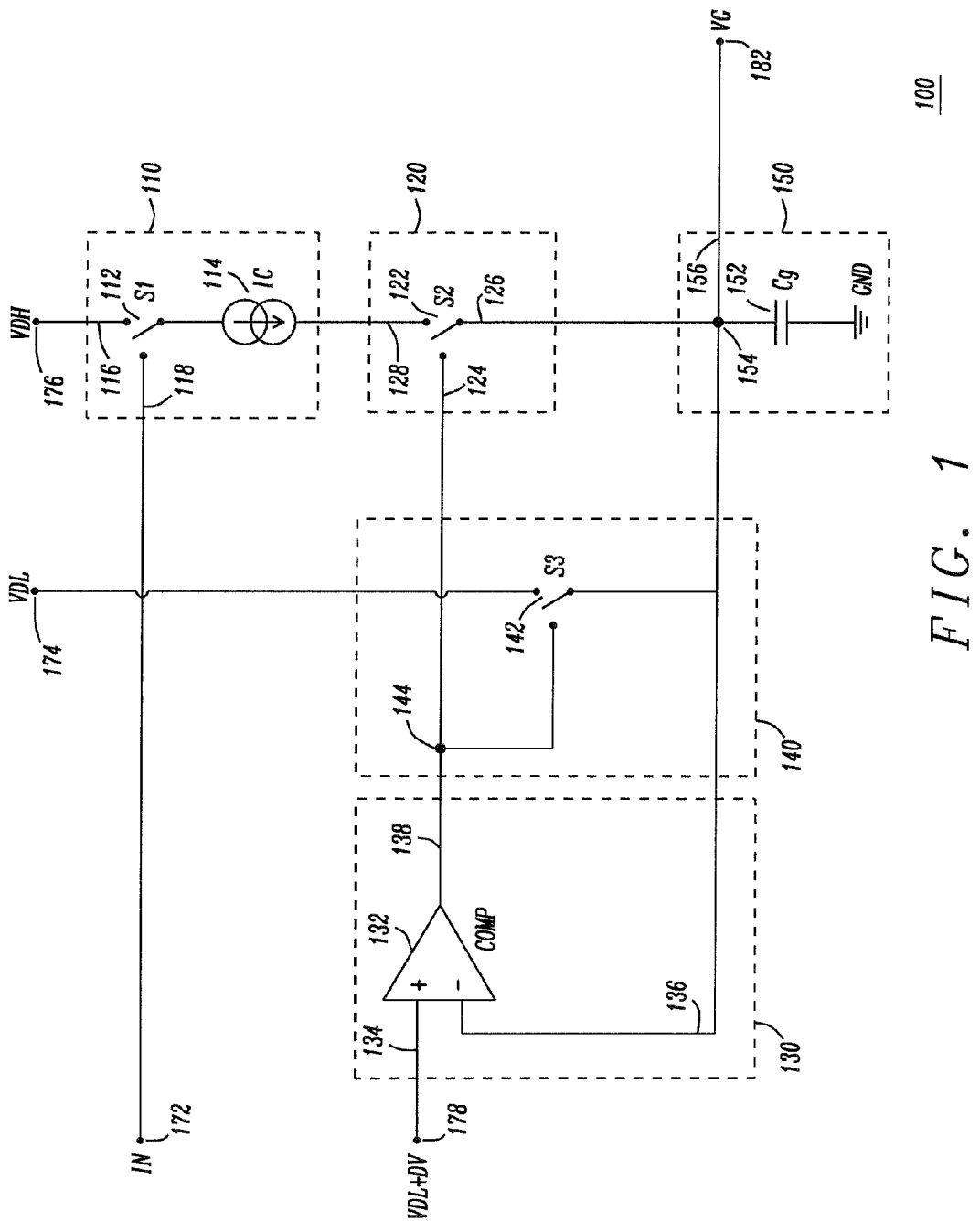
FIG. 1 is a circuit schematic diagram illustrating one example of the low voltage switching gate driver under a high voltage rail when the gate capacitance Cg is ground referenced in accordance with one embodiment of the disclosure.

FIG. 1 is a circuit schematic diagram illustrating one example of the low voltage switching gate driver 100 under a high voltage rail when the gate capacitance Cg is ground referenced in accordance with one embodiment of the disclosure. The device 100 includes the charging current source circuit 110, the voltage holding device 140, the gate comparator 130, the current gating devices 120, and the gate capacitance Cg of the power FET.

The charging current source circuit 110 includes a current switch S1 coupled to the external input signal IN 172 and the charging current source IG. The current switch S1 is preferably coupled to the high voltage rail (VDH) 176 through 116. The charging current source IG is preferably coupled to the current gating devices 120 for the current cut off after the gate voltage VG charged to the thresh hold level.

The current gating devices 120 includes a current switch S2. The current switch S2 is preferably coupled to the current path of the charging current source IG through 128 and the gate capacitance Cg at 154 through 126. It is controlled by the output of the gate comparator circuit 130 at 144 through 124.

The gate comparator 130 includes a voltage comparator COMP with one input preferably coupled to the reference voltage VDL+DV at 178, where DV is defined as the delta voltage. Another input is preferably coupled to the gate voltage Vg of the power FET at 154 through 136. The output of the voltage comparator COMP 136 is preferably coupled to the input of the voltage holding device 140 at 144 and the current switch S2 at 124.

The voltage holding device 140 includes a voltage switch S3 that is preferably coupled to the low voltage supply (VDL) at 174 and the gate voltage VG of the gate capacitance at 154. S3 is controlled by the output of the gate comparator COMP.

In the preferred embodiment, when the signal IN instructs the circuit to start switching the power FET, S1 is switched on first to power the current source IG using the high power rail (VDH) at 176. If the gate voltage VG is lower than VDL+DV at 134, the output 136 of the gate comparator COMP switches off the voltage holding device switch S3 and switches on the current gating device switch S2 to enable the charging current. The gate capacitance Cg is charged by the bulk current from VDH through the charging current source IG. VDL is not affected. When the gate voltage VG is charged to be larger than VDL+DV, the gate comparator COMP flips its output signal to switches on the voltage holding device switch S3 and switches off the current gating device switch S2. Then the charging current from VDH is cut off and the gate voltage VG is clamped to VDL though S3.

Figure 2:
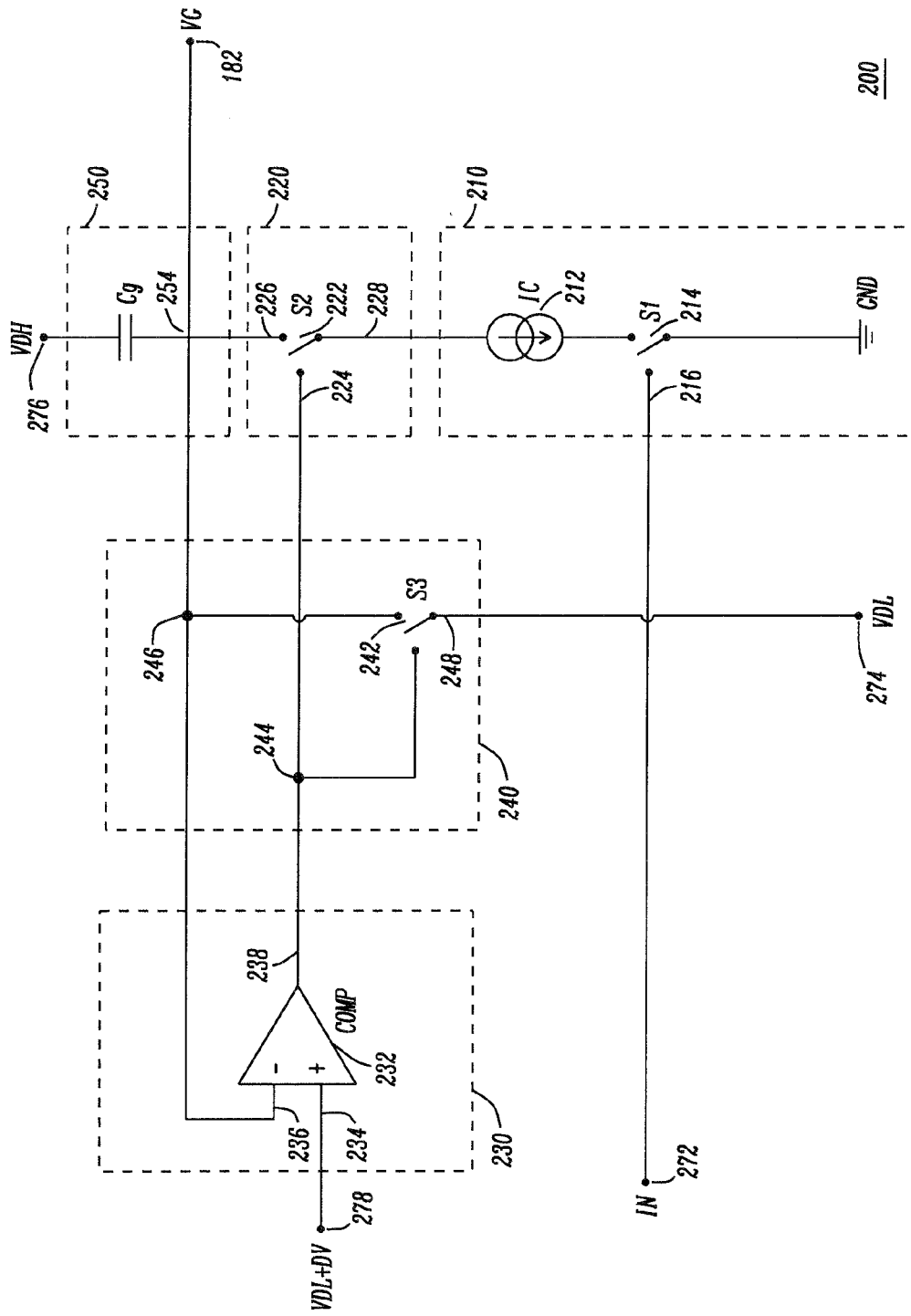
FIG. 2 is a circuit schematic diagram illustrating one example of the low voltage switching gate driver 200 under a high voltage rail when the gate capacitance Cg is high voltage rail referenced in accordance with one embodiment of the disclosure.

Referring now to FIG. 2, it is a circuit schematic diagram illustrating one example of the low voltage switching gate driver 200 under a high voltage rail when the gate capacitance Cg is high voltage rail referenced in accordance with one embodiment of the disclosure. The device 200 includes the charging current source circuit 210, the voltage holding device 240, the gate comparator 230, the current gating devices 220, and the gate capacitance Cg of the power FET.

The charging current source circuit 210 includes a current switch S1 coupled to the external input signal IN 272 and the charging current source IG. The current switch Si is preferably coupled to the GND through 214. The charging current source IG is preferably coupled to the current gating devices 220 for the current cut off after the gate voltage VG charged to the thresh hold level.

The current gating devices 220 includes a current switch S2. The current switch S2 is preferably coupled to the current path of the charging current source IG through 228 and the gate capacitance Cg at 254 through 226. It is controlled by the output of the gate comparator circuit 230 at 244 through 224.

The gate comparator 230 includes a voltage comparator COMP with one input preferably coupled to the reference voltage VDL+DV at 278 and another input preferably coupled to the gate voltage Vg of the power FET at 254 through 238. The output of the voltage comparator COMP 238 is preferably coupled to the input of the voltage holding device 240 at 244 and the current switch S2 at 224.

The voltage holding device 240 includes a voltage switch S3 that is preferably coupled to the low voltage supply (VDL) at 274 and the gate voltage VG of the gate capacitance at 254. S3 is controlled by the output of the gate comparator COMP.

In the preferred embodiment, when the signal IN instructs the circuit to start switching the power FET, S1 is switched on first to reference the current source IG using the GND. If the gate voltage VG is lower than VDL+DV at 234, the output 138 of the gate comparator COMP switches off the voltage holding device switch S3 and switches on the current gating device switch S2 to enable the charging current. The gate capacitance Cg is charged by the bulk current from VDH through the charging current source IG. VDL is not affected. When the gate voltage VG is charged to be larger than VDL+DV, the gate comparator COMP flips its output signal to switches on the voltage holding device switch S3 and switches off the current gating device switch S2. Then the charging current from VDH to GND is cut off and the gate voltage VG is clamped to VDL though S3.

In the proposed embodiment, implementing an accurate and fast comparison and fast current cut off switch S2 are important in avoiding the excessive overshoot caused by the charging current source 1G.

Figure 3:
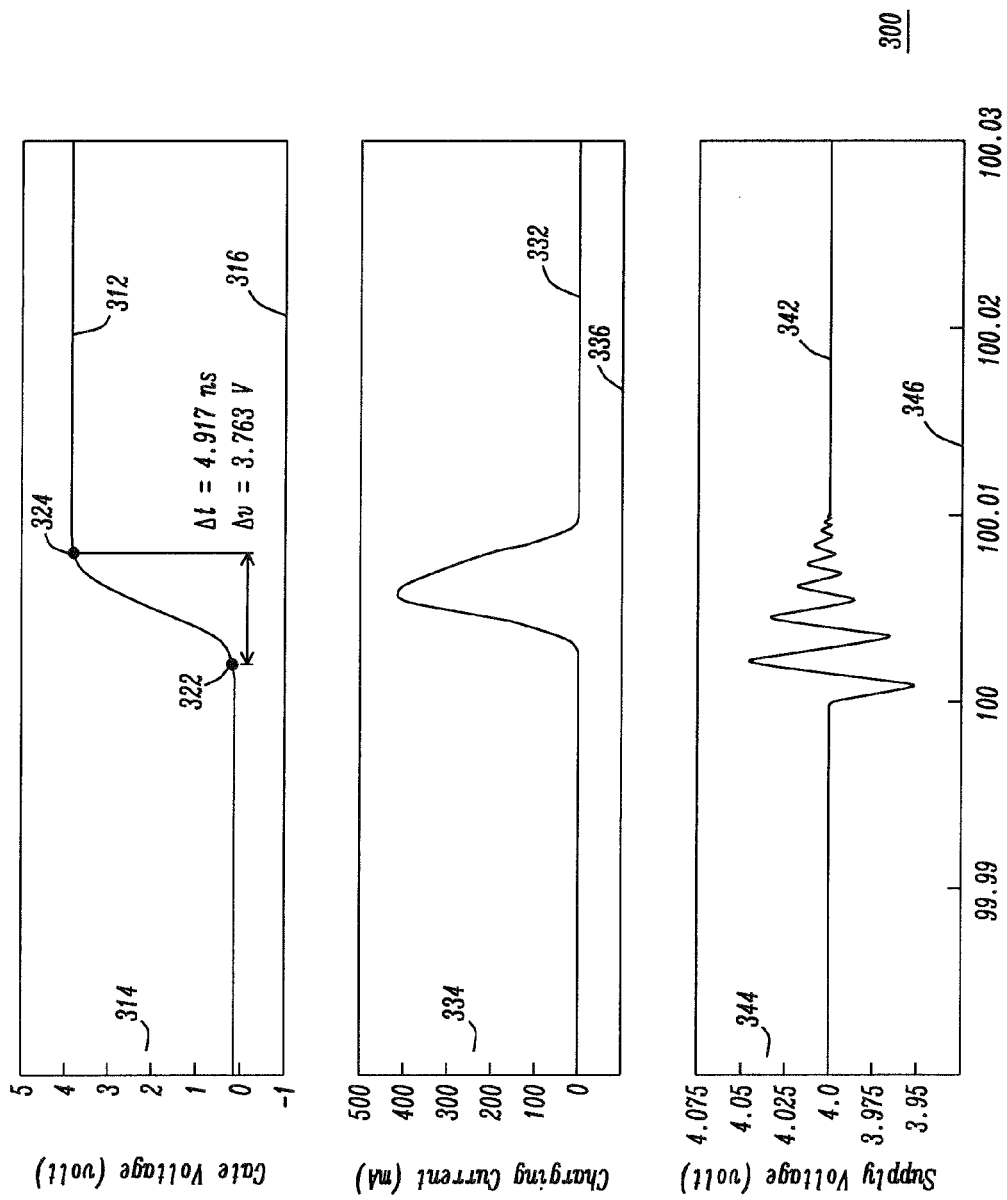
FIG. 3 is one example diagram illustrating the gate driving performance improvement with the low voltage gate driving circuit in accordance with one embodiment of the disclosure.

Referring now to FIG. 3, it is one example diagram illustrating the gate driving performance improvement with the low voltage gate driving circuit in accordance with one embodiment of the disclosure. The example shown in FIG. 1 is facilitated with the detailed setups as VDH=12 V max, VDH=4 V min, VDL=4V, and Cg=400 pF. The gate voltage charging curve 312 shows the fast gate voltage swing from 15% to 85% is 3.763 V in 4.917 nS. The charging current curve 332 is better predictable and its peak value is reduced to 439 mA. The VDL supply curve 342 with 1 nH stray inductance has a peak ripple 60 mV due to the RLC tank relaxation.

In the proposed embodiment, the improved charging performance and the reduced VDL ripple does not need external pins and on-chip decoupling. It allows VLD rail to be internal and save one external capacitor and a pin.

In the proposed embodiment, the VDL rail shares an existing supply without disturbing other sensitive analog functions. This allows saving silicon area since much less on-chip decoupling and clamping is needed.

The proposed embodiment is fully compatible with the use of a non-decoupled floating ground to supply the power stage.

Figure 4:
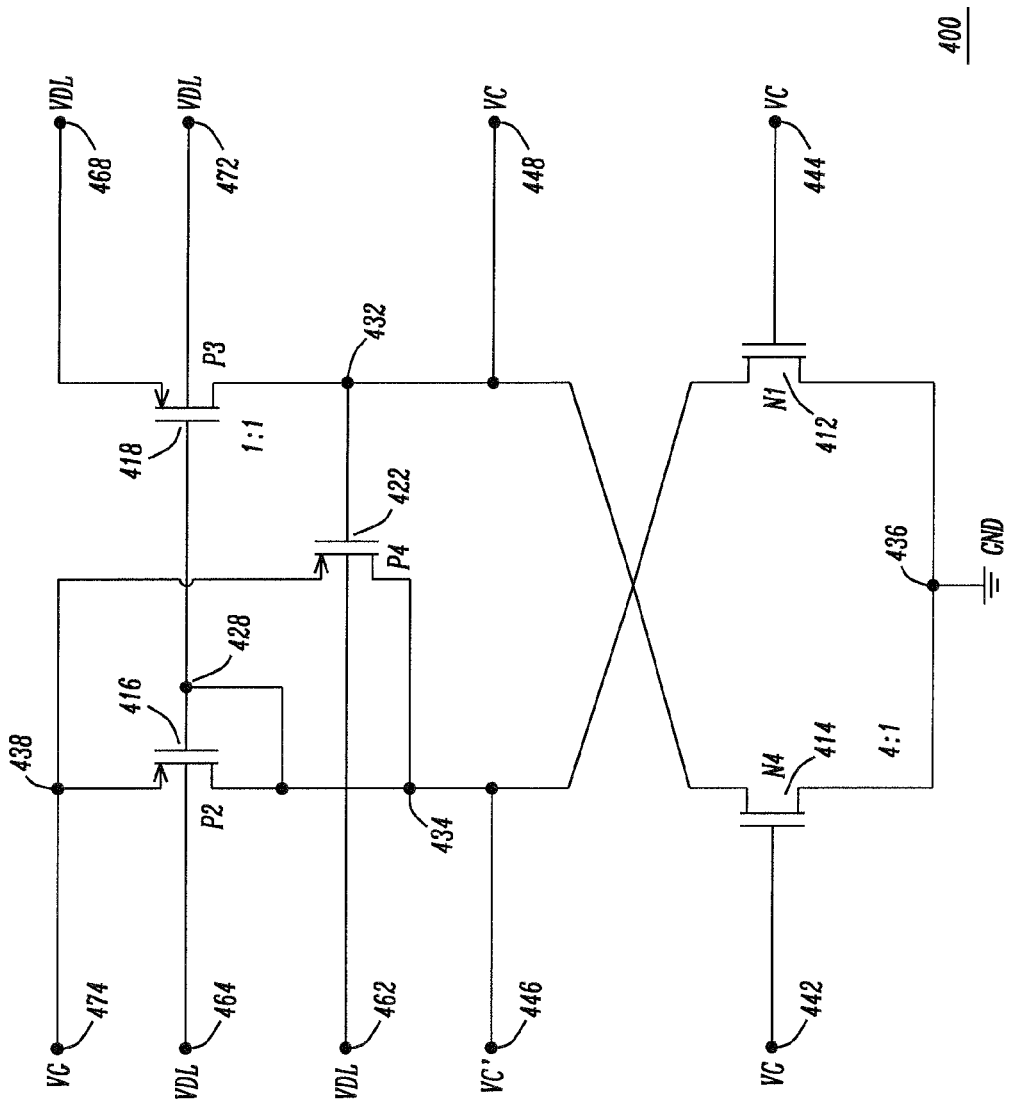
FIG. 4 is a circuit schematic diagram illustrating an ultra-fast gate sense comparator in accordance with one embodiment of the disclosure.

Referring now to FIG. 4, it is a circuit schematic diagram illustrating an ultra-fast gate sense comparator 400 in accordance with one embodiment of the disclosure. The device 400 includes matched NFET devices N1 and N2, PFET devices P2 and P3, and a switch PFET P4. N1 and N2 are preferably coupled to GND at 436. The gates of P2 and P3 are preferably coupled. The low voltage supply (VDL) is input through 468. The gate voltage VG is preferably coupled to PFET P2 and P4.

In the proposed embodiment, N1 and N4 are matched devices where N4 is set to four times of N1. When VG is driven low, N4 is in cutoff. N1 is fully on with the gate timed to VDL via P3. N1 and N4 are operating very close to the triode region due to the large VGS around the transition point and their small geometry. However, P2 and P3 must operate in the active region that is why they are sized much larger than N1 and N4. If N4 is identical to N1, the transition point would be when VG=VDL. But because N4 is 4 times bigger than N1 (and ignoring the back-gate effect difference between P2 and P3), the transition point is shifted from $$VDL \text{ by } DV(tt = \infty) \cong V_{gs}(P3) - V_{gs}(P2) = \sqrt{\frac{It}{\mu p \cdot C_{ox} \cdot W/L}},$$

where "It" is N1 transition current.

In the proposed embodiment, the comparator is regenerative in the sense that during the transition, the current increases in N4 while diminishing in N1 and P2 making the current sourced from P3 even smaller. It speeds up VC negative transition. For the circuit implemented, the transition current is typically 1 mA into N4, which is still more than two orders of magnitude smaller than the charging current 1 G~200 mA. Once node VC has triggered low, the transistor P4 will force VC' to VG. This in turn makes it harder for P3 to turn on as VG will need to drop by as much as $V_{GS}(P3) \gg DV$ to put the node VC back up again.

Figure 5:
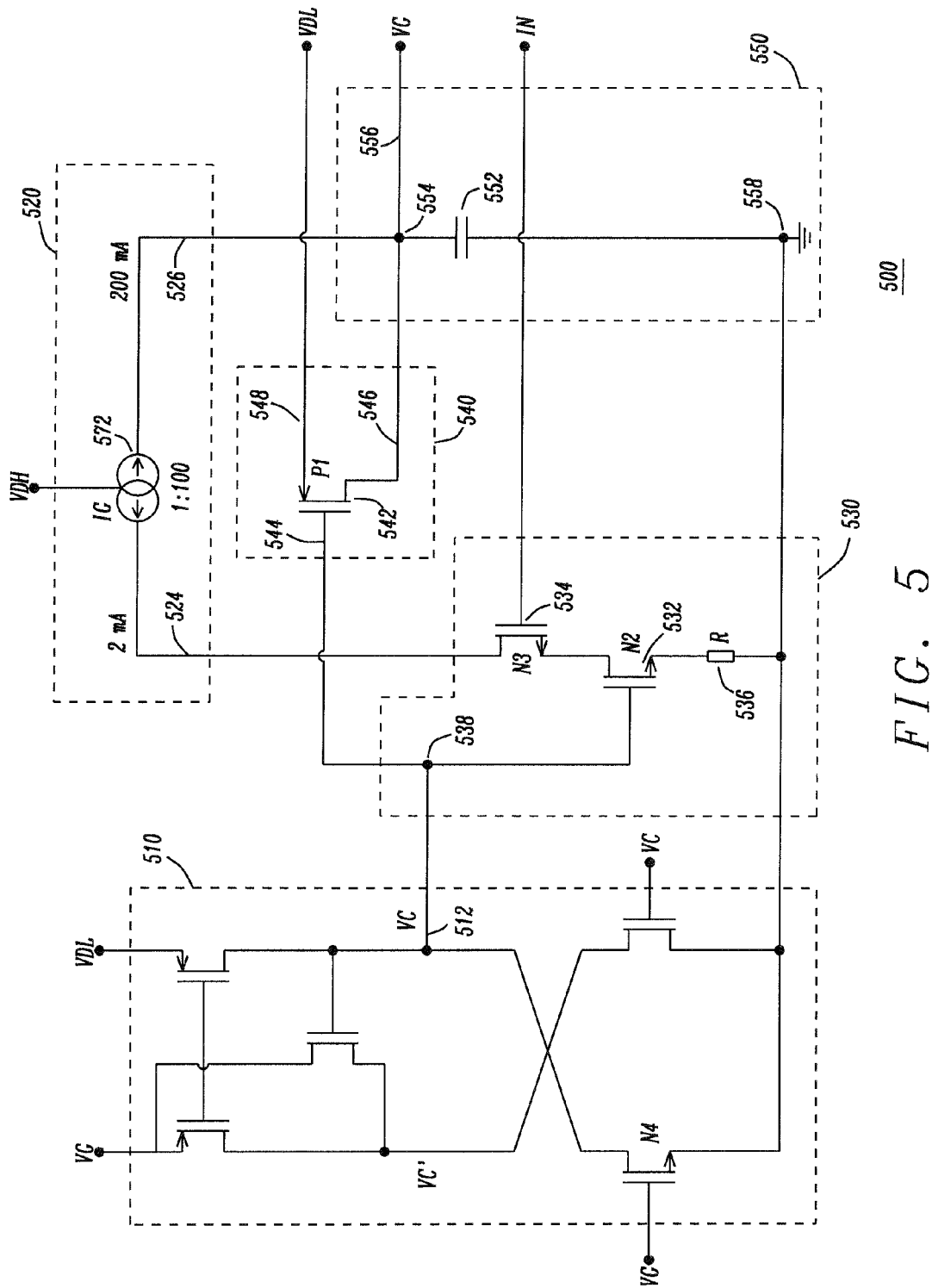
FIG. 5 is a circuit schematic diagram illustrating a simplified gate charging circuit when the gate capacitance Cg is ground referenced in accordance with one embodiment of the disclosure.

Referring now to FIG. 5, it is a circuit schematic diagram illustrating a simplified gate charging circuit 500 when the gate capacitance Cg is ground referenced in accordance with one embodiment of the disclosure. The device 500 includes ultra-fast gate sensing comparator 510, the charging current source circuit 520, the current gating device circuit 530, the voltage holding device 540, and the gate capacitance 550 of the power FET.

The ultra-fast gate sensing comparator 510 is preferably coupled to the current gating device circuit 530 and the voltage holding device 540 at 538 through VC 512. The charging current source circuit 520 includes a charging current source IG that is a 1:100 P-type current mirror preferably coupled to the high voltage rail (VDH). The 100 rail (200 mA) of IG is preferably coupled to the gate capacitance at 554 through 526. The 1 rail (2 mA) of IG is preferably coupled to N3 of the current gating device 530 through 524. The current gating device 530 includes the switch N3 preferably controlled by the input signal IN, the switch N2 preferably controlled by output of the ultra-fast gate sensing circuit 510, and a resistor R 536. The voltage holding device 540 includes a switch P1 preferably controlled by the output of the ultra-fast gate sensing comparator 510 through 544. The drain of P1 is preferably coupled to the gate voltage of the gate capacitance at 554 through 542. The source of P1 is preferably coupled to the low voltage supply (VDL) through 548.

In the proposed embodiment, the reference of the current source IG is 2 mA, which is set approximately by VDH- VGSP/R. By taking advantage of VDL accuracy, the reference current will predominantly depend on R tolerance.

In the proposed embodiment, P-type gate charge is preferred than the N-type gate charge because when high voltage NMOS is placed in series with the gate, the charge current will be more sensitive to the temperature and process variations. The gate could be level shifted higher than VDL. But when battery is low VDH=VDL, the gate shifting wouldn't be possible. Also inductive power ground bounces can corrupt the input to the comparator and make it skip the transition.

In the proposed embodiment, the complementary approach is also possible, where VDL could be a non-externally-decoupled floating ground. In this case, the charging current would flow from the output capacitor to the ground when the charging up the gate of a P-type power FET.

Figure 6:
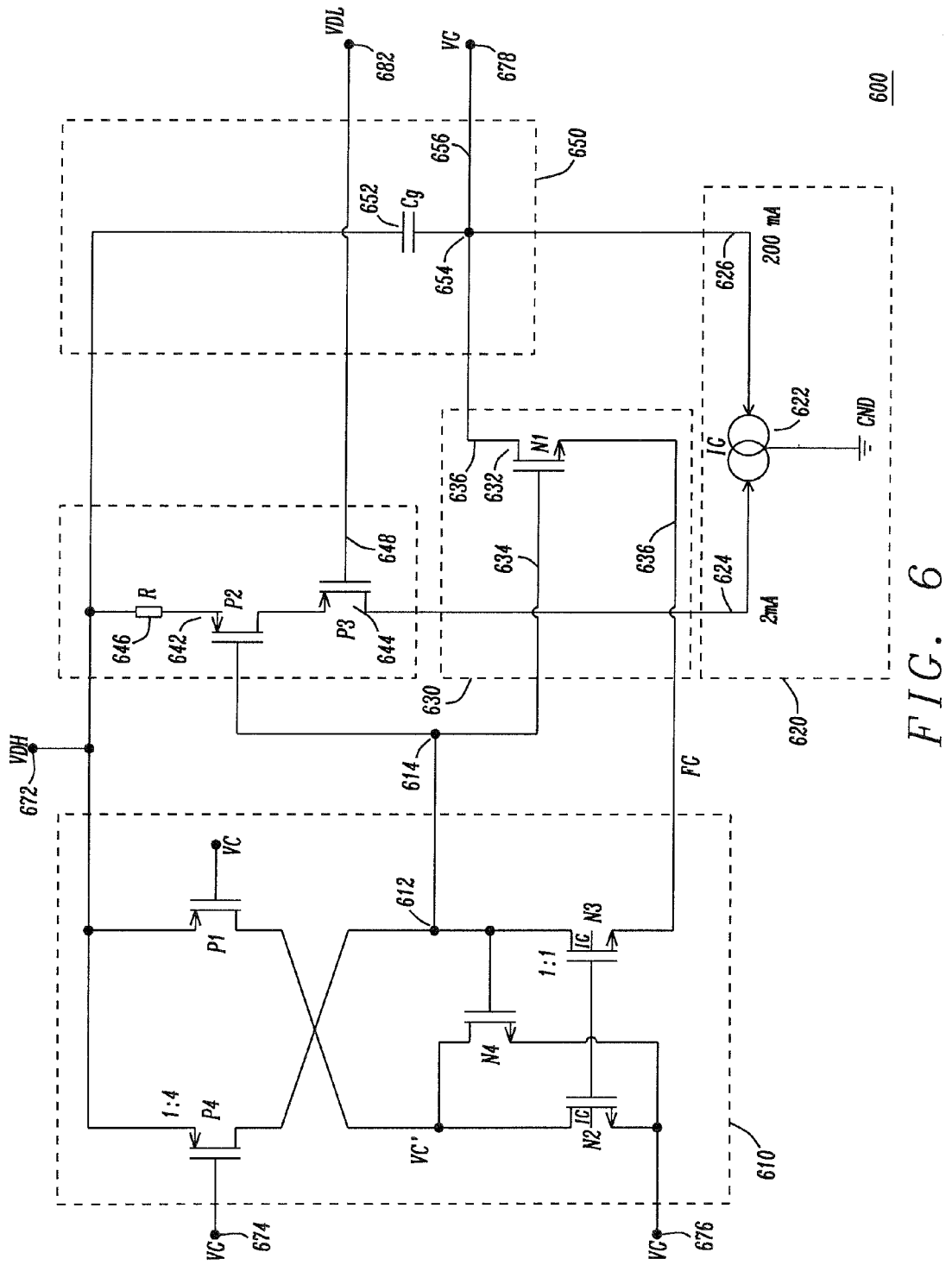
FIG. 6 is a circuit schematic diagram illustrating a simplified gate charging circuit 600 when VDL is a non-externally-decoupled floating ground (FG) and the power FET is referenced to VDH in accordance with one embodiment of the disclosure.
Figure 7:
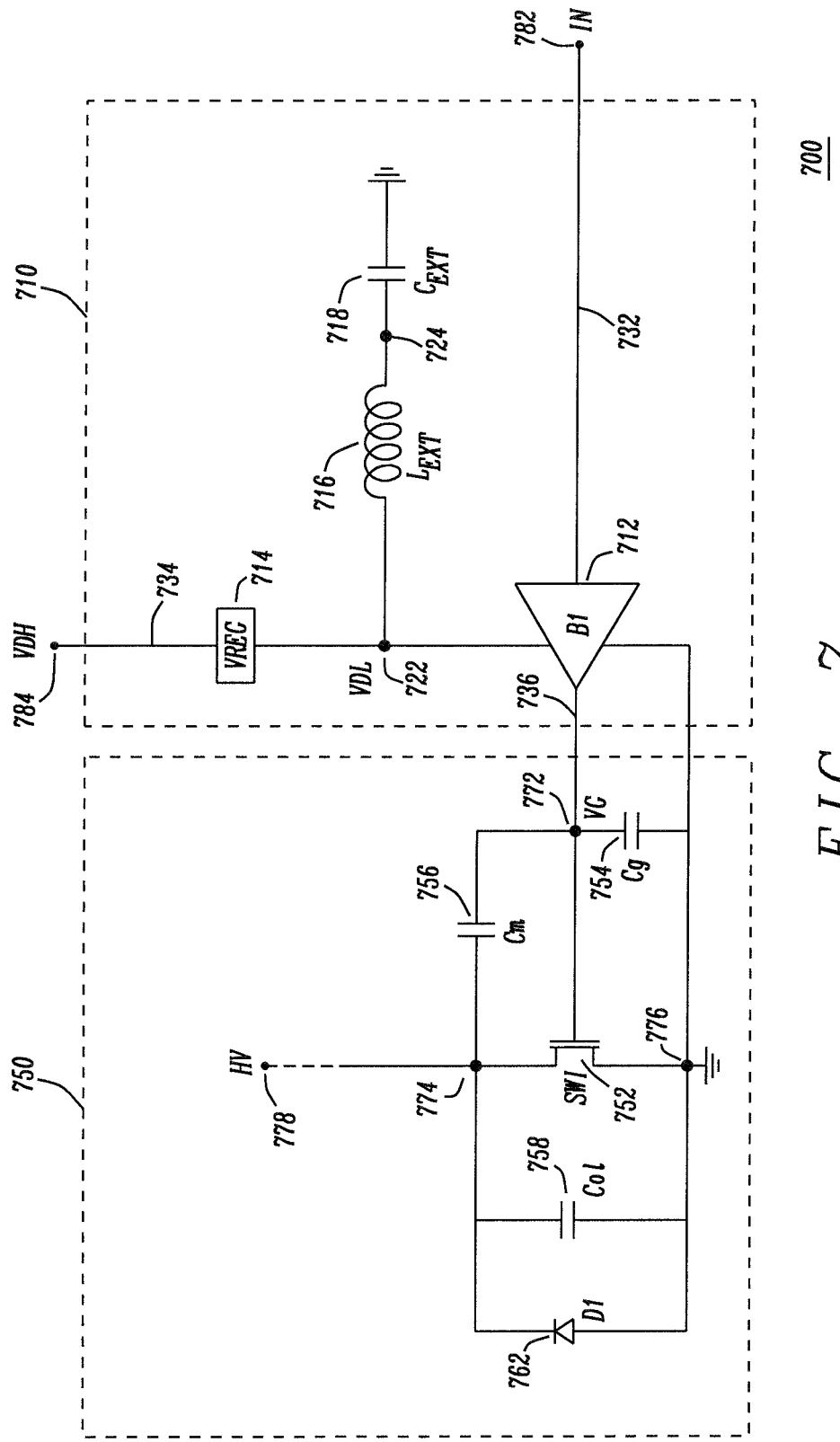
FIG. 7 is a circuit schematic diagram illustrating a prior art of the gate charging circuit.
Figure 8:
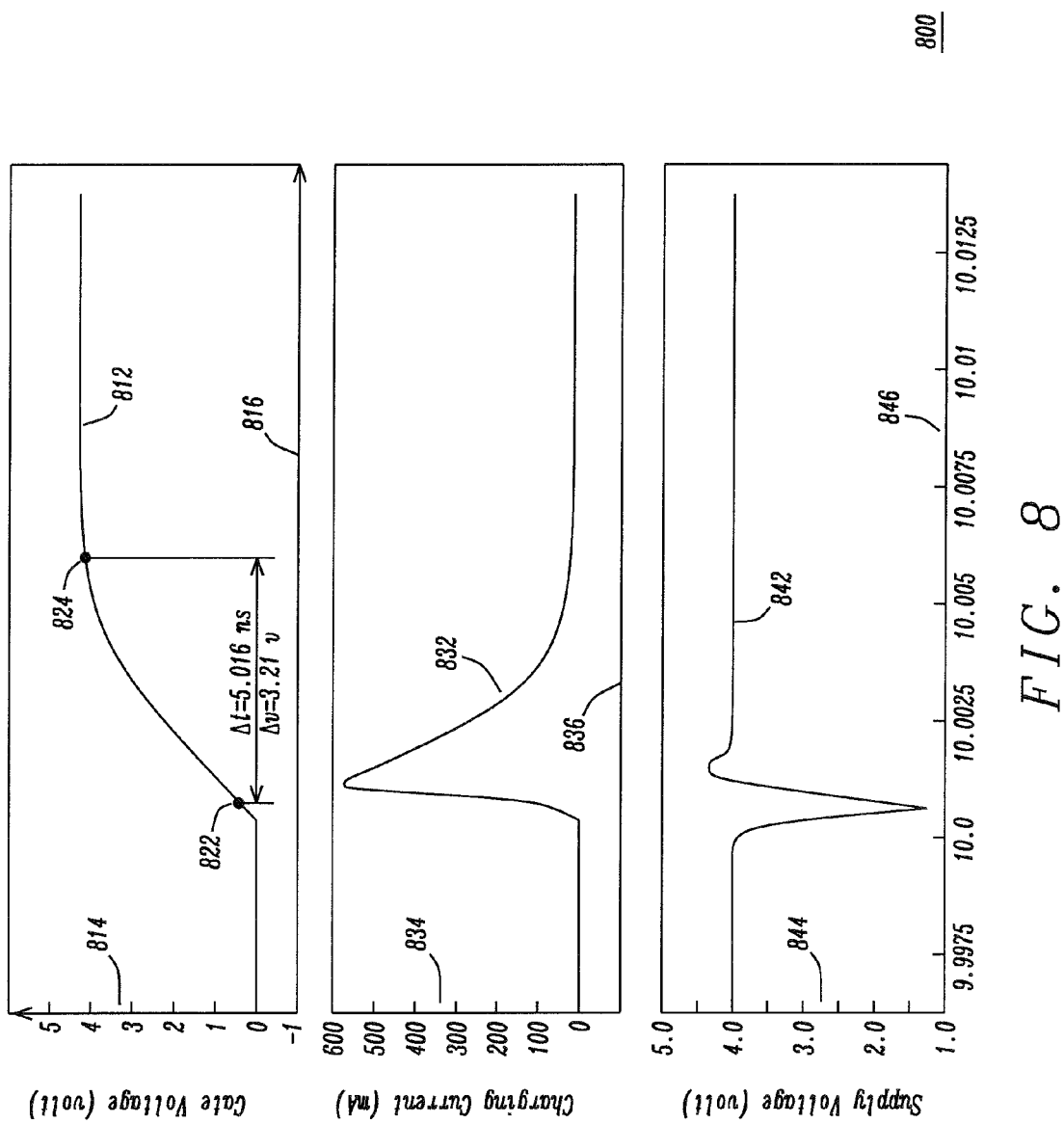
FIG. 8 is a diagram illustrating the charging performance of a prior art of the gate charging circuit.

Referring now to FIG. 6, it is a circuit schematic diagram illustrating a simplified gate charging circuit 600 when VDL is a non-externally-decoupled floating ground (FG) and the power FET is referenced to VDH in accordance with one embodiment of the disclosure. The device 600 includes ultra-fast gate sensing comparator 610, the charging current source circuit 620, the current gating device circuit 640, the voltage holding device 630, and the gate capacitance 650 of the power FET.

The ultra-fast gate sensing comparator 610 is preferably coupled to the current gating device circuit 640 and the voltage holding device 630 at 614 through 512. The gate N3 in 610 is configured to provide a non-externally-decoupled floating ground (FG) onto 636 as the low voltage supply (VDL). The charging current source circuit 620 includes a charging current source IG that is a 1:100 N-type current mirror preferably coupled to the high voltage rail (VDH). The 100 rail (200 mA) of IG is preferably coupled to the gate capacitance at 654 through 626. The 1 rail (2 mA) of IG is preferably coupled to P3 of the current gating device 640 through 624. The current gating device 640 includes the switch P3 preferably controlled by the input signal IN, the switch P2 preferably controlled by the output of the ultra-fast gate sensing circuit 610, and a resistor R 646. The voltage holding device 630 includes a switch N1 preferably controlled by the output of the ultra-fast gate sensing comparator 610 through 634. The drain of N1 is preferably coupled to the gate voltage of the gate capacitance Cg at 654 through 636. The source of N1 is preferably coupled to the FG low voltage supply (VDL) 636 from the ultra-fast gate sensing circuit 610.

In the proposed embodiment, the reference of the current source IG is 2 mA, which is set approximately by (VDH−VGSP)/R. By taking advantage of VDL accuracy, the reference current will predominantly depend on R tolerance.

Figure 9:
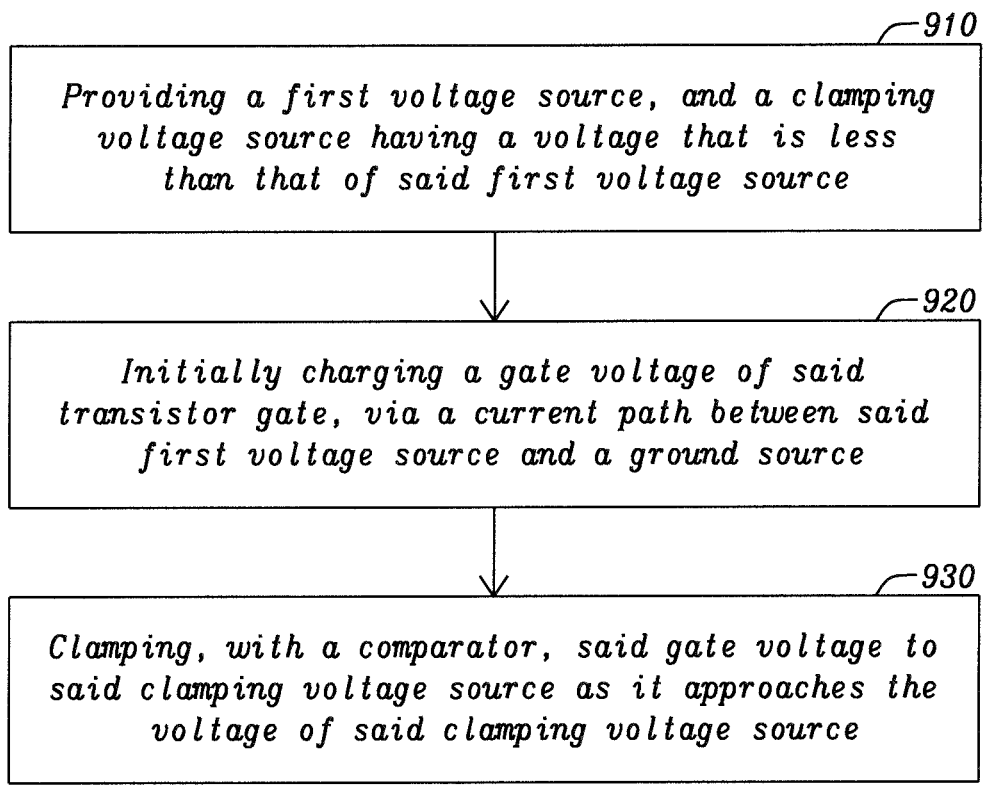
FIG. 9 is the flowchart illustrating the methodology of using low voltage switching gate driver under a high voltage rail.

Referring now to FIG. 9, it is the flowchart illustrating the methodology of using low voltage switching gate driver under a high voltage rail. As indicated by element 910, it provides a first voltage source, and a clamping voltage source having a voltage that is less than that of said first voltage source. Also as indicated by element 920, it initially charges a gate voltage of said transistor gate, via a current path between said first voltage source and a ground source. And as indicated by element 930 clamping, with a comparator, said gate voltage to said clamping voltage source as it approaches the voltage of said clamping voltage source.

The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A switching gate driver, comprising:
a first voltage source;
a clamping voltage source, configured to have a voltage that is less than that of said first voltage source;
a current path, for initial charging of a gate voltage of said switching gate, between said first voltage source and a ground source wherein said gate voltage is an input to a comparator and, wherein said current path is used to charge a gate capacitance; and
said comparator which is configured to clamp said gate voltage to said clamping voltage source as it approaches the voltage of said clamping voltage source.

2. The switching gate driver of claim 1, configured so that an input signal to said switching gate driver controls a first switch in said current path.

3. The switching gate driver of claim 1, wherein an output of said comparator is connected to a second switch in said current path.

4. The switching gate driver of claim 3, wherein said second switch is configured to be opened as said gate voltage approaches said clamping voltage.

5. The switching gate driver of claim 1, wherein an output of said comparator is configured to clamp said gate voltage by closing a third switch to connect said clamping voltage source to said gate voltage.

6. The switching gate driver of claim 1, wherein said clamping voltage source is from a regulated voltage supply, and said first voltage source is from an unregulated voltage supply.

7. The switching gate driver of claim 1, wherein said comparator comprises a PMOS current mirror cross-coupled to a pair of NMOS devices.

8. The switching gate driver of claim 7, wherein said pair of NMOS devices comprise a first device N4 driven by said gate voltage, a second device N1 driven by a an output voltage Vc of said comparator, wherein a ratio between said first and second devices is about 4:1.

9. The switching gate driver of claim 8, wherein said PMOS current mirror comprises a first PMOS device P2 having its source connected to said gate voltage, and a second PMOS device P3 having its source connected to said clamping voltage source.

10. The switching gate driver of claim 9, further comprising a PMOS device P4 having its source connected to said gate voltage, driven by said comparator output Vc, and its drain connected to a drain of said second NMOS device N1 and to a drain of said first PMOS device P2.

11. The switching gate driver of claim 10, wherein a second input to said comparator, which configures said comparator's transition point is shifted from said clamping voltage by an amount DV, where $$DV(tt = \infty) \cong V_{gs}(P3) - V_{gs}(P2) = \sqrt{\frac{I_t}{\mu_p \cdot C_{ox} \cdot W/L}},$$

wherein Vgs(P3) is a gate-to-source voltage of said second PMOS device P3, Vgs(P2) is a gate-to-source voltage of said first PMOS device P2. $I_t$ is a transition current through said second NMOS device N1, typically is 1 mA, $C_{ox}$ is oxide capacitance per unit gate area, and W/L is a width-to-length ratio of device.

12. A method for switching a transistor gate, comprising the steps of:
  providing a first voltage source, and a clamping voltage source having a voltage that is less than that of said first voltage source;
  initially charging a gate voltage of said transistor gate, via a current path between said first voltage source and a ground source wherein said gate voltage is an input to a comparator, wherein said initially charging a gate voltage is initiated by a transition of an input signal to close a first switch in said current path; and
  clamping, with said comparator, said gate voltage to said clamping voltage source as it approaches the voltage of said clamping voltage source.

13. The method for switching a transistor gate of claim 12, wherein said clamping with a comparator opens a second switch in said current path.

14. The method for switching a transistor gate of Claim 12, wherein an output of said comparator clamps said gate voltage by closing a third switch to connect said clamping voltage source to said gate voltage.

15. The method for switching a transistor gate of claim 12, wherein said clamping voltage source is from a regulated voltage supply, and said first voltage source is from an unregulated voltage supply.

16. The method for switching a transistor gate of claim 12, wherein said comparator comprises a PMOS current mirror cross-coupled to a pair of NMOS devices.

17. The method for switching a transistor gate of claim 16, wherein said pair of NMOS devices comprise a first device N4 driven by said gate voltage, a second device N1 driven by a an output voltage Vc of said comparator, wherein a ratio between said first and second devices is about 4:1.

* * * * *